(12) United States Patent
Ogino et al.

(10) Patent No.: US 10,566,411 B2
(45) Date of Patent: Feb. 18, 2020

(54) ON-CHIP RESISTORS WITH DIRECT WIRING CONNECTIONS

(71) Applicant: GLOBALFOUNDRIES Inc., Grand Cayman (KY)

(72) Inventors: Atsushi Ogino, Fishkill, NY (US); Lin Hu, Cohoes, NY (US); Brian Greene, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/834,443

(22) Filed: Dec. 7, 2017

(65) Prior Publication Data

US 2019/0181215 A1 Jun. 13, 2019

(51) Int. Cl.
| | |
|---|---|
| *H01L 49/02* | (2006.01) |
| *H01L 23/522* | (2006.01) |
| *H01L 23/528* | (2006.01) |
| *H01L 27/06* | (2006.01) |
| *H01L 23/532* | (2006.01) |
| *H01L 21/3105* | (2006.01) |
| *H01L 21/8234* | (2006.01) |
| *H01L 21/311* | (2006.01) |
| *H01L 21/768* | (2006.01) |

(52) U.S. Cl.
CPC ........ *H01L 28/20* (2013.01); *H01L 21/31053* (2013.01); *H01L 21/31116* (2013.01); *H01L 21/76802* (2013.01); *H01L 21/76877* (2013.01); *H01L 21/76897* (2013.01); *H01L 21/823437* (2013.01); *H01L 21/823475* (2013.01); *H01L 23/528* (2013.01); *H01L 23/5226* (2013.01); *H01L 23/5228* (2013.01); *H01L 23/53295* (2013.01); *H01L 27/0629* (2013.01)

(58) Field of Classification Search
None
See application file for complete search history.

(56) References Cited

U.S. PATENT DOCUMENTS

| | | | | |
|---|---|---|---|---|
| 8,298,902 B2* | 10/2012 | Dalton | ............... | H01L 21/76816 257/E21.575 |
| 2005/0042889 A1* | 2/2005 | Lee | ......................... | C23C 16/30 438/780 |
| 2005/0202683 A1* | 9/2005 | Wang | ................. | H01L 21/02115 438/763 |
| 2005/0202685 A1* | 9/2005 | Huang | .................... | C23C 16/02 438/780 |
| 2005/0250346 A1* | 11/2005 | Schmitt | ............. | H01L 21/76801 438/778 |
| 2006/0151851 A1* | 7/2006 | Pillai | ....................... | H01L 24/05 257/531 |
| 2007/0040239 A1* | 2/2007 | Chinthakindi | ...... | H01L 23/5228 257/536 |

(Continued)

*Primary Examiner* — Telly D Green
(74) *Attorney, Agent, or Firm* — Thompson Hine LLP; Anthony Canale

(57) ABSTRACT

Device structures and fabrication methods for an on-chip resistor. A resistor body is formed on an interlayer dielectric layer of a contact level. A contact is formed that extends vertically through the interlayer dielectric layer. One or more dielectric layers are formed over the contact level, and a metal feature is formed in the one or more dielectric layers. The metal feature is at least in part in direct contact with a portion of the resistor body.

20 Claims, 6 Drawing Sheets

(56) References Cited

U.S. PATENT DOCUMENTS

| | | | | |
|---|---|---|---|---|
| 2007/0281497 A1* | 12/2007 | Liu | ..................... | H01L 21/3105 |
| | | | | 438/781 |
| 2008/0164530 A1* | 7/2008 | Wang | ............. | H01L 21/823412 |
| | | | | 257/369 |
| 2010/0052181 A1* | 3/2010 | Werner | ............. | H01L 21/76829 |
| | | | | 257/773 |
| 2010/0090187 A1* | 4/2010 | Ahn | ........................ | H01L 27/24 |
| | | | | 257/2 |
| 2010/0164121 A1* | 7/2010 | Feustel | ............ | H01L 21/76804 |
| | | | | 257/774 |
| 2010/0237467 A1* | 9/2010 | Dalton | ............. | H01L 21/76816 |
| | | | | 257/536 |
| 2011/0049727 A1* | 3/2011 | Aubel | ............... | H01L 21/76826 |
| | | | | 257/773 |
| 2011/0156162 A1* | 6/2011 | Richter | ............... | H01L 27/0629 |
| | | | | 257/379 |
| 2011/0206857 A1* | 8/2011 | Yim | .................. | H01L 21/02126 |
| | | | | 427/493 |
| 2012/0193794 A1* | 8/2012 | Kim | ....................... | H01L 28/60 |
| | | | | 257/751 |
| 2012/0292741 A1* | 11/2012 | Dalton | ............. | H01L 21/76816 |
| | | | | 257/536 |
| 2014/0027700 A1* | 1/2014 | Nickel | .................... | H01L 45/08 |
| | | | | 257/3 |
| 2014/0131651 A1* | 5/2014 | Tu | ........................... | H01L 45/04 |
| | | | | 257/4 |
| 2014/0131654 A1* | 5/2014 | Tu | ........................... | H01L 45/04 |
| | | | | 257/4 |
| 2016/0181318 A1* | 6/2016 | Dong | .................. | G06F 12/0802 |
| | | | | 711/118 |

* cited by examiner

ON-CHIP RESISTORS WITH DIRECT WIRING CONNECTIONS

BACKGROUND

The invention relates generally to semiconductor device and integrated circuit fabrication and, in particular, to device structures and fabrication methods for an on-chip resistor.

On-chip resistors are passive devices found in many integrated circuits. An on-chip resistor may be formed by depositing a layer of resistor material having a given thickness and patterning the resistor material layer to provide a resistor body that is dimensioned to a particular length and width. The resistance of an on-chip resistor is based on a combination of physical properties (e.g., cross-sectional area and length) and material properties (i.e., resistivity).

The resistor body may be formed in a space that is arranged vertically between the first metallization level of a back-end-of-line (BEOL) structure and the front-end-of-line (FEOL) device structures. The space also includes a dielectric layer on which the resistor body is formed and contacts that connect the metal features in the first metallization level with the front-end-of-line device structures and with the resistor body. With downward scaling, the thicknesses of the dielectric layer and the resistor body may become roughly equal, which is problematic when forming contacts extending vertically from one of the metal features to the resistor body.

SUMMARY

In an embodiment of the invention, a structure includes a contact level with an interlayer dielectric layer and a contact extending vertically through the interlayer dielectric layer. The structure further includes one or more dielectric layers over the contact level, a resistor body on the interlayer dielectric layer, and a metal feature in the one or more first dielectric layers. The metal feature is at least in part in direct contact with a portion of the resistor body.

In an embodiment of the invention, a method includes forming an interlayer dielectric layer of a contact level and forming a contact extending vertically through the interlayer dielectric layer. The method further includes forming a resistor body on the interlayer dielectric layer, forming one or more dielectric layers over the contact level, and forming a metal feature in the one or more dielectric layers. The metal feature is at least in part in direct contact with a portion of the resistor body.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
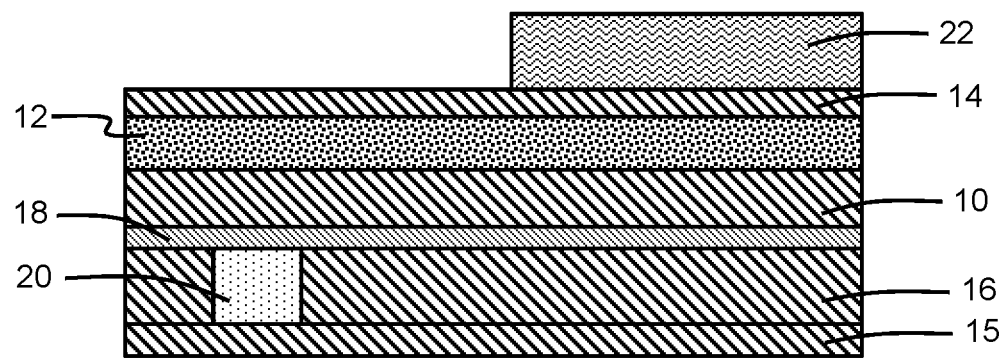
FIGS. 1-6 are cross-sectional views of a device structure at successive stages of a processing method in accordance with embodiments of the invention.

With reference to FIG. 1 and in accordance with embodiments of the invention, dielectric layers 10, 14 and a resistor material layer 12 are formed on a top surface of a dielectric layer 18. The dielectric layer 18 caps a dielectric layer 16, which includes a conductive feature 20. The dielectric layer 16 may be formed on a substrate 15, such as a bulk substrate or a semiconductor-on-insulator (SOI) substrate, that may include device structures formed by front-end-of-line (FEOL) processes and of which one or more of the device structures (e.g., field-effect transistors) are connected with the conductive feature 20. The dielectric layer 18 may be comprised of a dielectric material, such as silicon nitride ($Si_3N_4$), silicon dioxide ($SiO_2$), SiCN, SiON, SiCO, or SiC deposited by chemical vapor deposition (CVD). The dielectric layers 10, 14, and 16 may be composed of a dielectric material, such as such as silicon nitride ($Si_3N_4$), silicon dioxide ($SiO_2$), SiCN, SiON, SiCO, or SiC deposited by chemical vapor deposition (CVD). The dielectric layer 10 and the dielectric layer 18 may be combined to form a single layer. The conductive feature 20 may be composed of one or more conductors, such as a metal silicide, cobalt (Co), titanium (Ti), titanium nitride (TiN), copper (Cu), ruthenium (Ru), and/or tungsten (W), and may be a contact that is connected with a source/drain region or a gate electrode of a field-effect transistor.

The resistor material layer 12 is arranged vertically between the dielectric layer 10 and the dielectric layer 14. The resistor material constituting the resistor material layer 12 has a given resistivity and a given temperature coefficient of resistance (TCR) that may be either positive or negative. The resistor material layer 12 may be composed of a metal that is suitable to form the body of a resistor. In an embodiment, the resistor material layer 12 may be composed of tungsten silicide ($WSi_x$) that is deposited by physical vapor deposition (PVD) with, for example, a sputtering process. The amount, x, of silicon in the deposited tungsten silicide may be determined, at least in part, by the composition of a sputter target used in the PVD process. The TCR of tungsten silicide varies as a function of the amount of silicon in its composition. In another embodiment, the resistor material layer 12 may be composed of a different material, such as titanium nitride (TiN) or doped polysilicon.

An etch mask 22 is formed on the top surface of the dielectric layer 14. The etch mask 22 may include, for example, a bottom anti-reflective coating (BARC) layer, a spin-on hard mask, SiON, and/or a photoresist layer comprised of a photoresist material that is applied by a spin coating process, pre-baked, exposed to a radiation projected through a photomask, baked after exposure, and developed with a chemical developer to form a feature at the intended location for a resistor body to be subsequently patterned from the resistor material layer 12 by etching.

Figure 2:
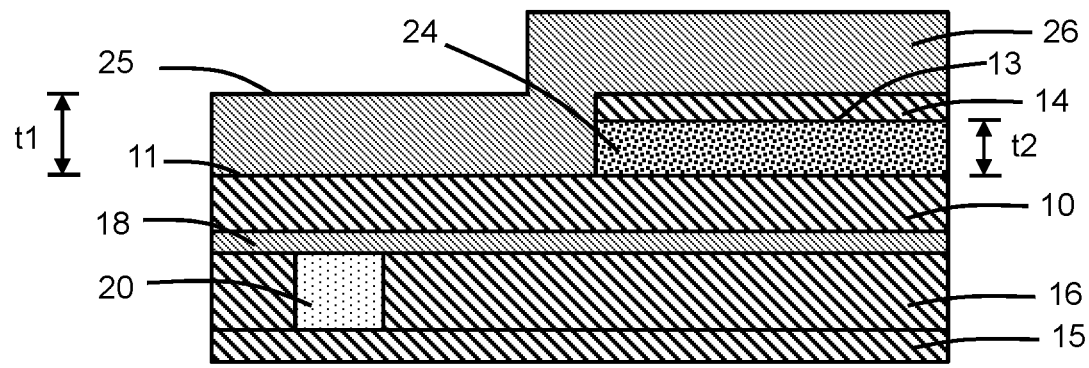

With reference to FIG. 2 in which like reference numerals refer to like features in FIG. 1 and at a subsequent fabrication stage, a resistor body 24 is formed by patterning the partially-masked resistor material layer 12 using an etching process selected to remove the material of resistor material layer 12 from areas not masked by the etch mask 22. The dielectric layer 14 is also removed by the etching process across the unmasked area. The etching process, which may be a reactive-ion etching (RIE) process, may be conducted in a single etching step or multiple etching steps with different etch chemistries. The etch chemistry for the etching process that penetrates through the resistor material layer 12 is selected to stop on the material of the dielectric layer 10.

The resistor body 24 is composed of material originating from the resistor material layer 12, may be rectangular in shape, and may have the thickness and composition of the resistor material layer 12. The resistor body 24 has a cross-sectional area and a length that, in conjunction with the resistivity of the material, establishes a value of electrical resistance.

The etch mask 22 may be stripped after the dielectric layer 14 is patterned with the patterned dielectric layer 14 being used to pattern the resistor body 24. Alternatively, the etch mask 22 may be stripped after the resistor body 24 is patterned.

A dielectric layer 26 is deposited that covers the resistor body 24 and the dielectric layer 10 adjacent to the resistor body 24. The dielectric layer 26, which acquires the underlying topography, may be comprised of a dielectric material with etch selectivity to the dielectric layer 10, such as silicon carbonitride (SiCN) deposited by chemical vapor deposition (CVD). The dielectric layer 26 has a thickness, t1, relative to a top surface 11 of the dielectric layer 10 that is greater than the thickness, t2, of the resistor body 24 relative to a top surface 11 of the dielectric layer 10.

Figure 3:
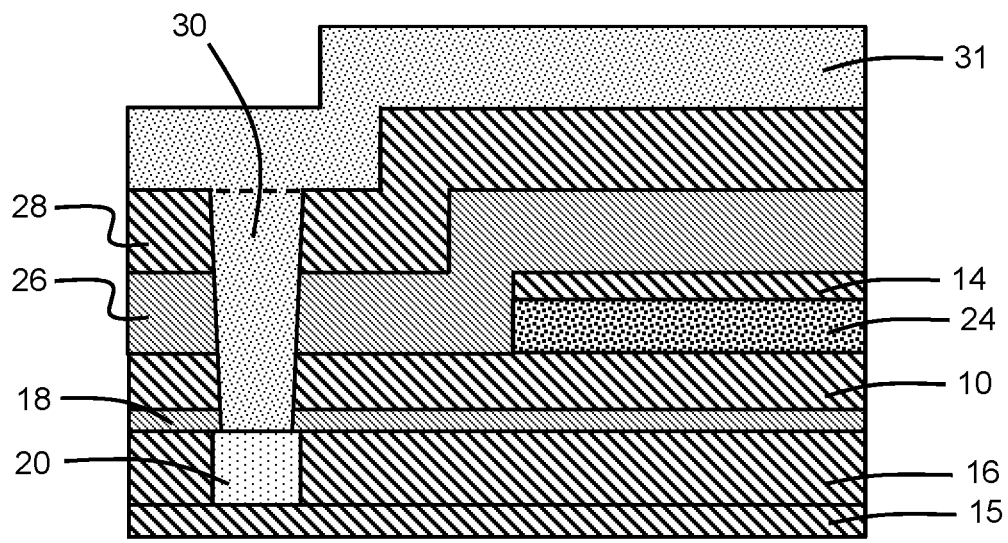

With reference to FIG. 3 in which like reference numerals refer to like features in FIG. 2 and at a subsequent fabrication stage, a dielectric layer 28 is deposited that covers the dielectric layer 26. The dielectric layer 28 may be comprised of a dielectric material with etch selectivity to the dielectric layer 10, such as silicon dioxide ($SiO_2$) deposited by chemical vapor deposition (CVD). In alternative embodiments, the dielectric layers 10, 26, 28 may have the same or a similar composition and/or the number of layers 10, 26, 28 may vary.

A contact 30 is formed by depositing a conductor layer 31 in an opening defined in the dielectric layers 10, 18, 26, 28 that extends to the conductive feature 20 in dielectric layer 16. The opening for the contact 30 may be formed by applying an etch mask to the dielectric layer 28 and patterning the layers with an etching process, which may include one or more reactive ion etching (RIE) processes employing one or more etch chemistries. The contact 30 may include a barrier layer coating the opening and may include one or more conductors, such as a metal silicide, cobalt (Co), titanium (Ti), titanium nitride (TiN), copper (Cu), ruthenium (Ru), and/or tungsten (W), of the conductor layer 31. The individual thicknesses of the different dielectric layers 10, 26, 28 are selected to provide a total film thickness at the top and bottom of the resistor body 24 that is sufficient to provide the thickness differential, discussed above, without introducing process control issues for the formation of the contact 30 and its opening.

Figure 4:
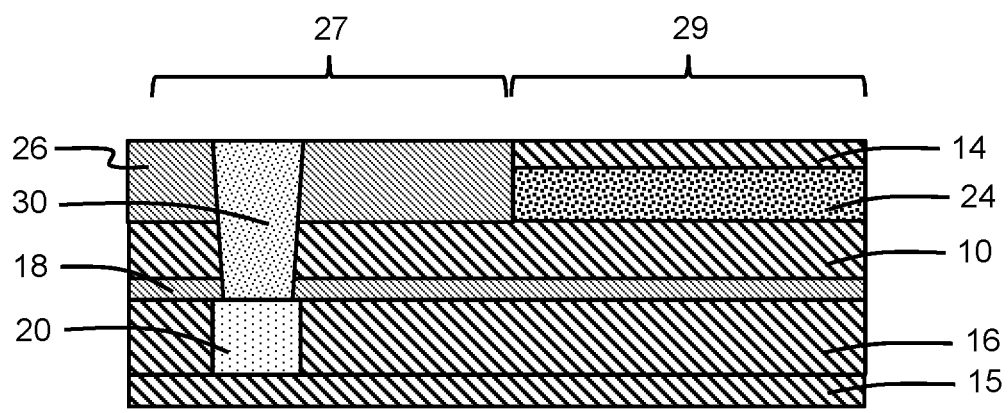

With reference to FIG. 4 in which like reference numerals refer to like features in FIG. 3 and at a subsequent fabrication stage, the conductor layer 31 is planarized with chemical mechanical processing (CMP) such that the contact 30 is coplanar with the top surface of the dielectric layer 26. The planarization removes the dielectric layer 28 from the top surface of the resistor body 24 while shortening the height of the contact 30. Material removal is controlled such that the polishing process is halted when the top surface of the dielectric layer 26 is encountered. The resistor body 24 is not polished and all or a partial thickness of the dielectric layer 14 is retained over the resistor body 24 when polishing is halted. The thickness differential between the dielectric layer 26 and the resistor body 24, of which the dielectric layer 26 is thicker relative to the top surface 11 of the dielectric layer 10, enables the non-polishing of the resistor body 24.

The resistor body 24 is located in a region 29 of a contact level that includes the dielectric layer 26 and the dielectric layer 10, as well as the section of the dielectric layer 14 over the resistor body 24. The region 29 is free of contacts 30 and is also free of conductive features 20 in dielectric layer 16. A region 27 of the contact level includes the contact 30 and also includes the conductive feature 20 in the dielectric layer 16. A section of the dielectric layer 26 remains in region 27, and the contact 30 extends through the dielectric layer 26, as well as the dielectric layer 18, to the conductive feature 20.

Figure 5:
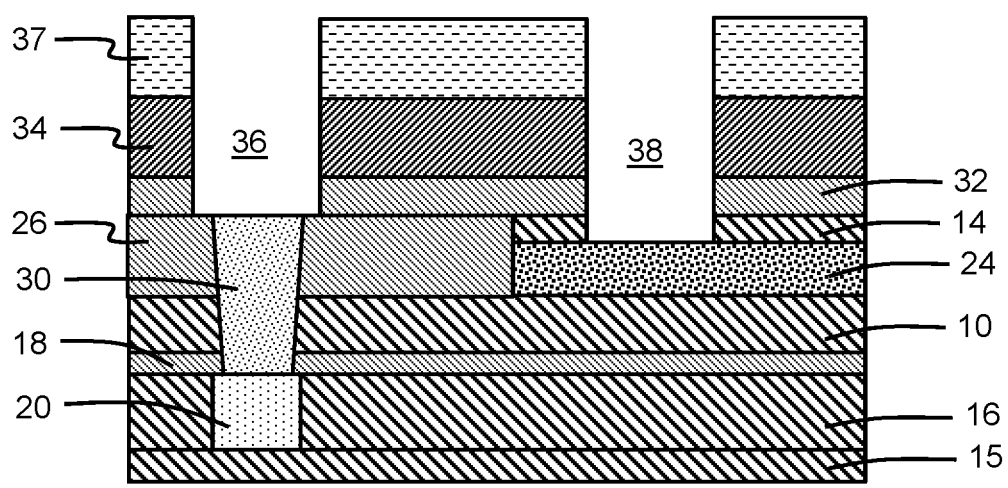

With reference to FIG. 5 in which like reference numerals refer to like features in FIG. 4 and at a subsequent fabrication stage, dielectric layers 32, 34 of a metallization level are formed on the planarized surface of the contact level that includes the top surfaces of dielectric layer 26 and the dielectric layer 14. The dielectric layer 32 provides a capping film between the dielectric layer 34 and the planarized surface of the contact level. The dielectric layer 34 may be composed of a low-k dielectric material or an ultra-low-k (ULK) dielectric material having a dielectric constant that is less than the dielectric constant of silicon dioxide. Alternatively, the dielectric layer 34 may be composed of silicon dioxide ($SiO_2$) or a layered combination of silicon dioxide and a low-k dielectric material or an ultra-low-k dielectric material. The dielectric layer 32 may be composed of a dielectric material, such as silicon carbonitride (SiCN), silicon nitride ($Si_3N_4$), aluminum oxide (AlO), SiOC, or aluminum oxynitride (AlON) deposited by chemical vapor deposition (CVD).

Interconnect openings 36, 38 of the metallization level are formed by photolithography and etching at selected locations distributed across the surface area of dielectric layer 34. Specifically, an etch mask 37 is formed on the top surface of the dielectric layer 14. The etch mask 37 may include, for example, a bottom anti-reflective coating (BARC) layer, a spin-on hard mask, a SiON layer, and/or a photoresist layer comprised of a photoresist material that is applied by a spin coating process, pre-baked, exposed to a radiation projected through a photomask, baked after exposure, and developed with a chemical developer to form a feature at the intended locations for the interconnect openings 36, 38. The etch mask 37 is used during a dry etching process, such as a reactive-ion etching (ME), that removes portions of the dielectric layers 32, 34 to form the interconnect openings. The etching process may be conducted in a single etching step or multiple etching steps with different etch chemistries and with the use of additional layers in the lithographic stack. Alternatively, the interconnect openings 36, 38 may be formed by self-aligned double patterning (SADP), self-aligned double patterning (SAQP), SADP+LE (Litho-Etch), or LELELE triple patterning. The etch mask 37 may be stripped after patterning a hardmask included in the etch mask 37, and the patterned hardmask may then be used to pattern the dielectric layers 32, 34 to form the interconnect openings 36, 38. Alternatively, the etch mask 37 may be stripped after the interconnect openings 36, 38 are patterned in the dielectric layers 32, 34.

The interconnect opening 36 extends vertically through the dielectric layers 32, 34 to the contact 30. The interconnect opening 38 extends vertically through the dielectric layers 32, 34 and also extends vertically through the dielectric layer 14 to the resistor body 24. The etch chemistry removing the dielectric layer 14 to extend the interconnect opening 38 through the dielectric layer 14 is selective to the material of the resistor body 24. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 6:
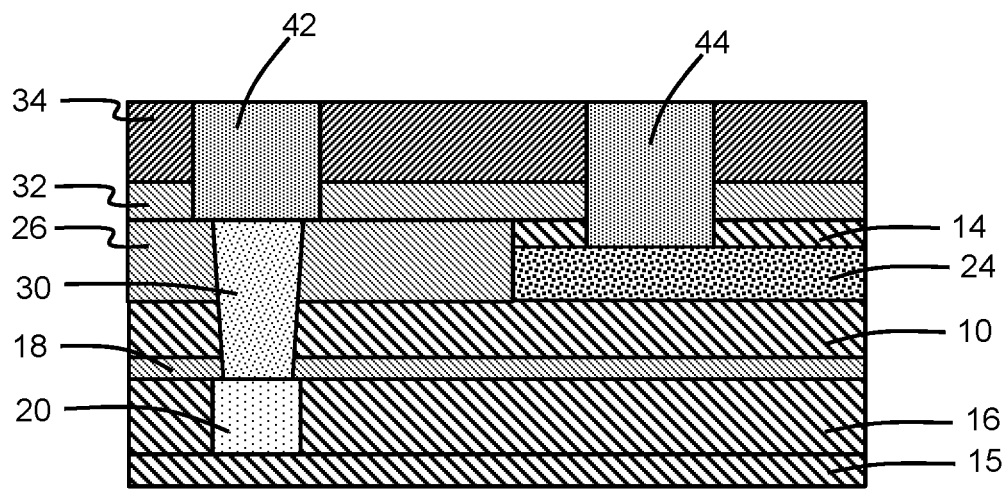

With reference to FIG. 6 in which like reference numerals refer to like features in FIG. 5 and at a subsequent fabrication stage, an interconnect feature 42 is formed inside the interconnect opening 36, and an interconnect feature 44 is formed inside the interconnect opening 38. The interconnect features 42, 44 of the metallization level may be formed from a conductor deposited by electroless deposition or may be formed by a reflow process. The interconnect features 42, 44 may be composed of a conductor, such as copper (Cu), a copper-manganese (Cu—Mn) alloy, cobalt (Co), ruthenium (Ru), tungsten (W), or another metal. The interconnect features 42, 44 may include a barrier/liner layer composed of cobalt (Co), titanium (Ti), titanium nitride (TiN), tantalum (Ta), tantalum nitride (TaN), ruthenium (Ru), or a multilayer combination of these materials (e.g., a Ta/TaN bilayer) arranged between the inner conductor and the dielectric layer 32, 34.

The materials of the interconnect features 42, 44 located above the top surface of the dielectric layer 34 may be removed with a chemical mechanical polishing (CMP) process. Material removal during the CMP process combines abrasion and an etching effect that polishes the targeted material and may be conducted with a commercial tool using polishing pads and slurries selected to polish the targeted material(s). The conductor of the interconnect features 42, 44 is planarized relative to the top surface of the dielectric layer 34 by the CMP process. Alternatively, a CMP stopping layer may be formed on the top surface of the dielectric layer 34, for example, before the interconnect openings 36, 38 are formed and later used during the planarization.

The interconnect feature 42, which is a wire of the metallization level formed by a damascene process in the dielectric layers 32, 34, is connected with the contact 30. The interconnect feature 44, which is also a wire of the metallization level, is in direct contact with the resistor body 24 absent an intervening contact.

Figure 7:
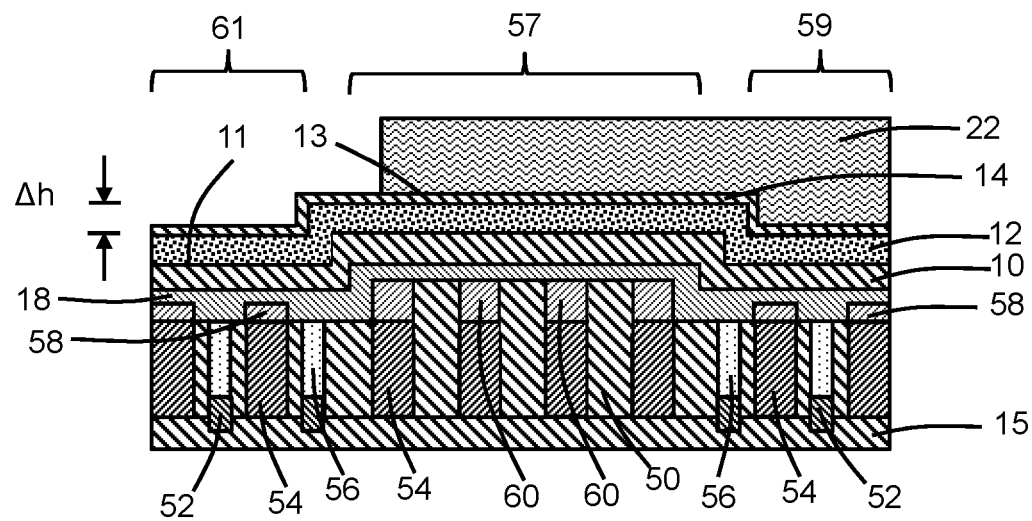
FIGS. 7-11 are cross-sectional views of a device structure at successive stages of a processing method in accordance with alternative embodiments of the invention.

With reference to FIG. 7 in which like reference numerals refer to like features in FIG. 1 and in accordance with alternative embodiments of the invention, the dielectric layers 10, 14 and resistor material layer 12 are formed on a top surface of the dielectric layer 18, and the etch mask 22 is applied. The dielectric layer 16 caps one or more dielectric layers 50. Arranged in the one or more dielectric layers 50 are a plurality of source/drain regions 52, a plurality of gate structures 54, and a plurality of conductive features 56 connected with the source/drain regions 52. The conductive features 56 may be composed of one or more conductors, such as a metal silicide, cobalt (Co), and/or tungsten (W).

The gate structures 54 are covered by self-aligned contact (SAC) caps 58 of a given thickness in regions 59 and 61 of the contact level. In a region 57 of the contact level, the gate structures 54 are covered by self-aligned contact (SAC) caps 60 of a given thickness that is greater than the thickness of the self-aligned contact caps 58. The result of the thickness differential is that the dielectric layers 10, 14, 16 and the resistor material layer 12 acquire and adopt the topography of the underlying self-aligned contact caps 58, 60, which are composed of a dielectric material and used during the formation of the conductive features 56 to provide alignment during etching with the source/drain regions 52. The thickness differential arises from the absence of conductive features 56 in region 57, and introduces a step representing a change in the elevation of a top surface 13 of the resistor material layer 12 relative to the top surface 11 of the dielectric layer 10 given by a height differential, $\Delta h$.

Figure 8:
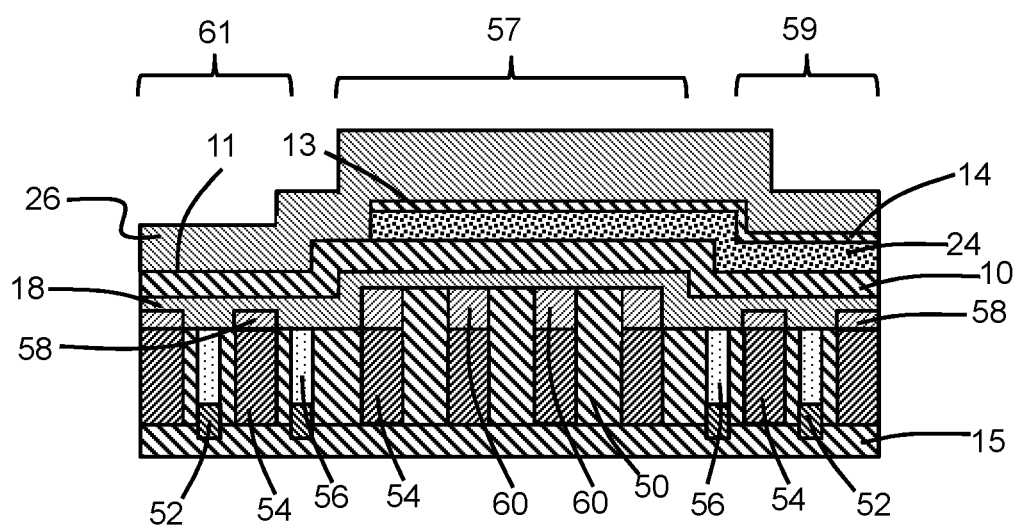

With reference to FIG. 8 in which like reference numerals refer to like features in FIG. 7 and at a subsequent fabrication stage, the resistor body 24 is formed by patterning the partially-masked resistor material layer 12 using an etching process and the etch mask 22 as described in connection with FIG. 2. After stripping the etch mask 22, the dielectric layer 26 is deposited that covers the resistor body 24 and the dielectric layer 10 adjacent to the resistor body 24. The thickness of the dielectric layer 26 is greater than the thickness of the resistor body 24 and therefore greater than the thickness of the resistor material layer 12 from which the resistor body 24 was patterned. The dielectric layer 26 conforms to the same topography as the resistor material layer 12, which results in a top surface 25 of the dielectric layer 26 having the same height differential as the top surface 13 of the resistor material layer 12 relative to a top surface 11 of the dielectric layer 10. The resistor material layer 12 is removed from the top surface 11 of the dielectric layer 10 in region 61 of the contact level.

Figure 9:
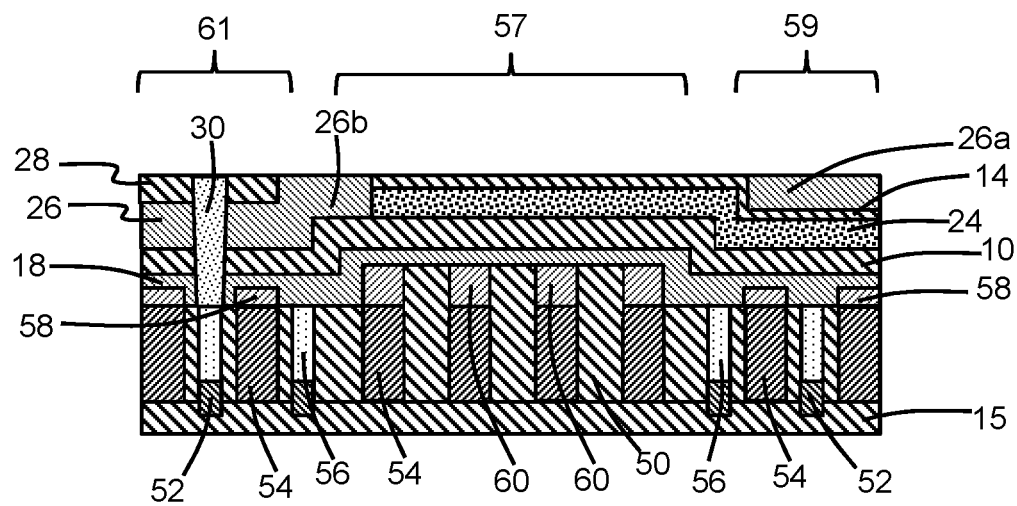

With reference to FIG. 9 in which like reference numerals refer to like features in FIG. 8 and at a subsequent fabrication stage, the dielectric layer 28 is deposited that covers the dielectric layer 26, the contact 30 is formed, and the structure is planarized with chemical mechanical processing (CMP) as described in FIGS. 3 and 4. In an embodiment, the contact 30 may be connected with one of the conductive features 56. Alternatively, the contact 30 may be coupled with other types of conductive features. The planarization removes the dielectric layer 28 in region 57 while shortening the height of the contact 30. Material removal is controlled such that the polishing process is halted when the top surface of the dielectric layer 26 is encountered in the region adjacent to the resistor body 24. The resistor body 24 is arranged between a section 26a of the dielectric layer 26 and a section 26b of the dielectric layer 26.

The resistor body 24 is not polished, and all or a partial thickness of the dielectric layer 14 is retained over the resistor body 24 when polishing is halted. This control over the polishing preserves the height differential of the top surface 13 of the resistor body 24 between the section of the resistor body 24 in region 57 of a contact level and the section of the resistor body 24 in region 59 of the contact level. The thickness differential between the dielectric layer 26 and the resistor body 24, of which the dielectric layer 26 is thicker, enables the non-polishing of the resistor body 24.

Figure 10:
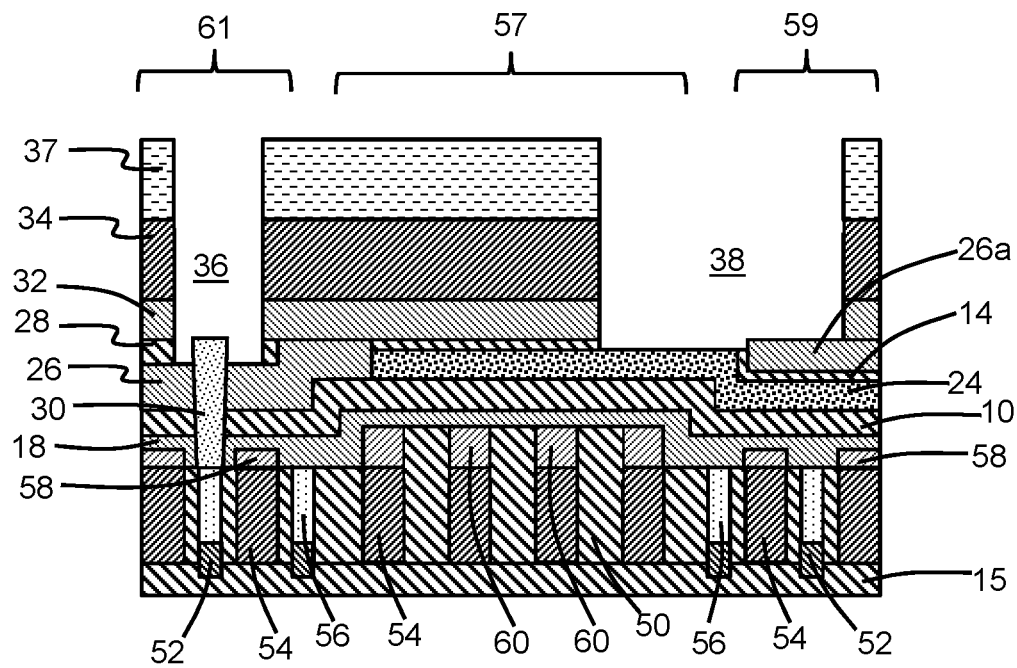

With reference to FIG. 10 in which like reference numerals refer to like features in FIG. 9 and at a subsequent fabrication stage, the dielectric layers 32, 34 are deposited, and the interconnect openings 36, 38 are formed. The interconnect opening 36 extends vertically through the dielectric layers 32, 34 to the contact 30. The interconnect opening 38 extends vertically through the dielectric layers 32, 34 and the dielectric layer 14 to the resistor body 24. The interconnect opening 38 is formed in a self-aligned manner because the etching process forming interconnect opening 38 removes the material of the dielectric layer 32 selective to the material of the dielectric layer 26. As a result, the section 26a of the dielectric layer 26 is arranged in the vertical direction between the bottom of the interconnect opening 38 and the resistor body 24.

Figure 11:
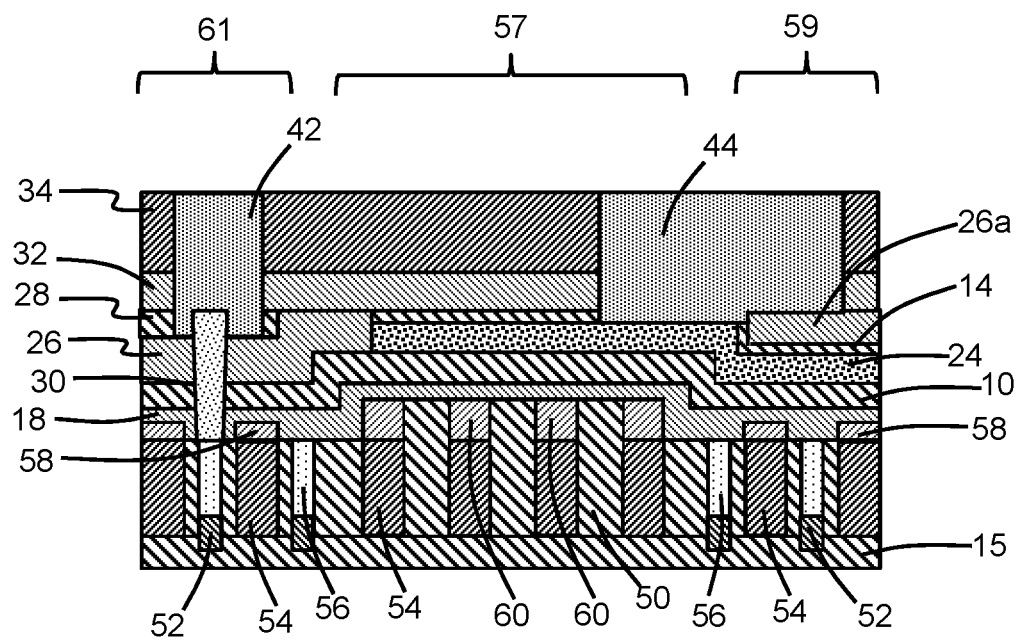

With reference to FIG. 11 in which like reference numerals refer to like features in FIG. 10 and at a subsequent fabrication stage, the interconnect features 42, 44 are formed in the dielectric layers 32, 34. The interconnect feature 42 is connected with the contact 30 and a portion of the interconnect feature 44 is in direct contact with the resistor body 24 and without any intervening contacts. Another portion of the interconnect feature 44 is separated from the resistor body 24 by the section of the dielectric layer 28. The intervening section 26a of the dielectric layer 26 prevents a short circuit between the portion of the interconnect feature 44 not in direct contact with the resistor body 24 and the remainder of the resistor body 24.

Figure 12:
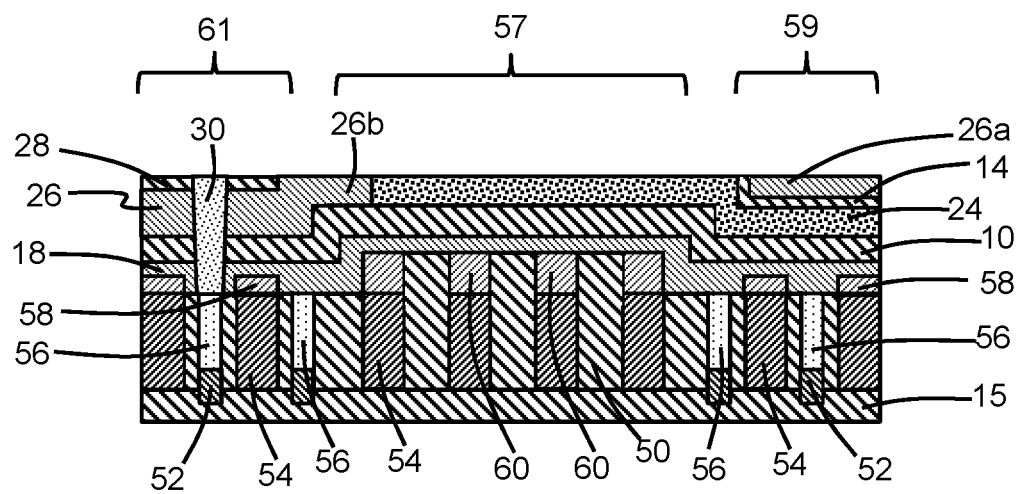
FIG. 12 is a cross-sectional view of a device structure subsequent to FIG. 8 of a processing method in accordance with alternative embodiments of the invention.

With reference to FIG. 12 in which like reference numerals refer to like features in FIG. 8 and at a subsequent fabrication stage of a processing method in accordance with alternative embodiments of the invention, the dielectric layer 28 is deposited that covers the dielectric layer 26, the contact 30 is formed that is connected with one of the conductive features 56, and the structure is planarized with chemical mechanical processing (CMP) as described in FIGS. 3 and 4. The planarization removes the dielectric layer 28 in region 57 while shortening the height of the contact 30. Material removal is controlled such that the polishing process is halted when the top surface of the resistor body 24 is encountered. The resistor body 24 is preferably not polished and, in this embodiment, the entire thickness of the dielectric layer 14 over the resistor body 24 is removed by the polishing. The thickness differential between the dielectric layer 26 and the resistor body 24 results in the section 26a of the dielectric layer 26, while being thinned, being arranged between the portion of the interconnect feature 44 not in direct contact with the resistor body 24 and the remainder of the resistor body 24. The process flow continues as described in connection with FIGS. 10 and 11.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a contact level including a first dielectric layer, a second dielectric layer over the first dielectric layer, a contact extending vertically through the first dielectric layer and the second dielectric layer, a resistor body including a first portion, a second portion, and a third portion each positioned on the first dielectric layer, and a third dielectric layer including a first section over the first portion of the resistor body and a second section positioned between the second portion of the resistor body and the second dielectric layer; and
   a metallization level over the contact level, the metallization level including a first wire connected with the contact and a second wire,
   wherein the second wire includes a first section that is positioned between the first section of the third dielectric layer and the second section of the third dielectric layer to directly contact the third portion of the resistor body.

2. The structure of claim 1 wherein the second dielectric layer includes a first section arranged adjacent to the first portion of the resistor body.

3. The structure of claim 2 wherein the first section of the second dielectric layer has a thickness, the third portion of the resistor body has a thickness, and the thickness of the first section of the second dielectric layer is greater than the thickness of the third portion of the resistor body.

4. The structure of claim 2 wherein the second wire includes a second section, and the first section of the second dielectric layer and the second section of the third dielectric layer are positioned between the second section of the second wire and the second portion of the resistor body.

5. The structure of claim 2 wherein the second dielectric layer includes a second section arranged on the first dielectric layer adjacent to the first portion of the resistor body, and the contact extends through the second section of the second dielectric layer.

6. The structure of claim 1 wherein the first portion and the third portion of the resistor body are arranged in a first region of the contact level and the second portion of the resistor body is arranged in a second region of the contact level, and the third portion of the resistor body and the second portion of the resistor body are arranged at different elevations to provide a height differential between the first region of the contact level and the second region of the contact level.

7. The structure of claim 6 further comprising:
   a first gate structure beneath the first dielectric layer in the first region of the contact level;
   a second gate structure beneath the first dielectric layer in the second region of the contact level;
   a first dielectric cap on the first gate structure; and
   a second dielectric cap on the second gate structure,
   wherein the first dielectric cap is taller than the second dielectric cap.

8. The structure of claim 2 wherein the first section of the second dielectric layer has a thickness, the third portion of the resistor body has a thickness, and the thickness of the first section of the second dielectric layer is less than the thickness of the third portion of the resistor body.

9. The structure of claim 1 wherein the first portion, the second portion, and the third portion of the resistor body are positioned directly on the first dielectric layer.

10. The structure of claim 1 wherein the first section of the second wire directly contacts the third portion of the resistor body without an intervening contact.

11. A method comprising:
forming a first dielectric layer and a second dielectric layer of a contact level, wherein the second dielectric layer is arranged over the first dielectric layer;
forming a contact extending vertically through the first dielectric layer and the second dielectric layer;
forming a resistor body including a first portion, a second portion, and a third portion each positioned on the first dielectric layer;
forming a third dielectric layer including a first section over the first portion of the resistor body and a second section positioned between the second portion of the resistor body and the second dielectric layer; and
forming a metallization level over the contact level,
wherein the metallization level includes a first wire connected with the contact and a second wire that includes a first section that is positioned between the first section of the third dielectric layer and the second section of the third dielectric layer to directly contact the third portion of the resistor body.

12. The method of claim 11 wherein the second dielectric layer includes a first section arranged adjacent to the first portion of the resistor body.

13. The method of claim 12 wherein the first section of the second dielectric layer has a thickness, the third portion of the resistor body has a thickness, and the thickness of the first section of the second dielectric layer is greater than the thickness of the third portion of the resistor body, and further comprising:
removing a second section of the second dielectric layer from a top surface of the resistor body with a polishing process,
wherein the polishing process stops on the top surface of the first section of the second dielectric layer.

14. The method of claim 12 wherein the second dielectric layer includes a second section arranged on the first dielectric layer adjacent to the first portion of the resistor body, and the contact extends vertically through the second section of the second dielectric layer.

15. The method of claim 12 wherein the second wire includes a second section, the third dielectric layer includes a second section, and the first section of the second dielectric layer and the second section of the third dielectric layer are positioned between the second section of the second wire and the second portion of the resistor body.

16. The method of claim 12 wherein the second dielectric layer includes a second section arranged on the first dielectric layer adjacent to the third portion of the resistor body, and the contact extends through the second section of the second dielectric layer.

17. The method of claim 11 wherein the first portion and the third portion of the resistor body are arranged in a first region of the contact level and the second portion of the resistor body is arranged in a second region of the contact level, and the third portion of the resistor body and the second portion of the resistor body are arranged at different elevations to provide a height differential between the first region of the contact level and the second region of the contact level.

18. The method of claim 17 further comprising:
forming a first gate structure beneath the first dielectric layer in the first region of the contact level;
forming a second gate structure beneath the first dielectric layer in the second region of the contact level;
forming a first dielectric cap on the first gate structure; and
forming a second dielectric cap on the second gate structure,
wherein the first dielectric cap is taller than the second dielectric cap.

19. The method of claim 11 wherein forming the metallization level over the contact level comprises:
etching an opening extending through the third dielectric layer; and
filling the opening with a conductor to form the second wire,
wherein the first section of the second dielectric layer self-aligns the etching of the opening.

20. The method of claim 12 wherein the first section of the second dielectric layer has a thickness, the third portion of the resistor body has a thickness, and the thickness of the first section of the second dielectric layer is less than the thickness of the third portion of the resistor body.

* * * * *